(12) United States Patent  (10) Patent No.: US 9,087,259 B2
Pekar et al.  (45) Date of Patent: Jul. 21, 2015

(54) ORGAN-SPECIFIC ENHANCEMENT FILTER FOR ROBUST SEGMENTATION OF MEDICAL IMAGES

(75) Inventors: Vladimir Pekar, Toronto (CA); Arish A. Qazi, Toronto (CA)

(73) Assignee: Koninklijke Philips N.V., Eindhoven (NL)

( * ) Notice: Subject to any disclaimer, the term of this patent is extended or adjusted under 35 U.S.C. 154(b) by 110 days.

(21) Appl. No.: 13/812,057

(22) PCT Filed: Jul. 25, 2011

(86) PCT No.: PCT/IB2011/053309
§ 371 (c)(1),
(2), (4) Date: Jan. 24, 2013

(87) PCT Pub. No.: WO2012/014146
PCT Pub. Date: Feb. 2, 2012

(65) Prior Publication Data
US 2013/0121549 A1  May 16, 2013

Related U.S. Application Data

(60) Provisional application No. 61/369,266, filed on Jul. 30, 2010.

(51) Int. Cl.
G06K 9/34  (2006.01)
G06T 7/00  (2006.01)

(52) U.S. Cl.
CPC .............. *G06K 9/34* (2013.01); *G06T 7/0012* (2013.01); *G06T 7/0087* (2013.01); *G06T 2207/10072* (2013.01); *G06T 2207/10081* (2013.01); *G06T 2207/10104* (2013.01); *G06T 2207/10108* (2013.01); *G06T 2207/10136* (2013.01); *G06T 2207/20076* (2013.01); *G06T 2207/20081* (2013.01); *G06T 2207/30004* (2013.01)

(58) Field of Classification Search
None
See application file for complete search history.

(56) References Cited

U.S. PATENT DOCUMENTS 6,246,784 B1 * 6/2001 Summers et al. ............. 382/128
6,331,116 B1 * 12/2001 Kaufman et al. ............. 434/262
6,343,936 B1 * 2/2002 Kaufman et al. ............. 434/262

(Continued)

FOREIGN PATENT DOCUMENTS

CN  101706843 B  9/2011
WO  2005008587 A1  1/2005

(Continued)

OTHER PUBLICATIONS

Cootes, T. F., et al.; Active Appearance Models; 2001; IEEE Trans. on Pattern Analysis and Machine Intelligence; 23(6)681-685.

(Continued)

*Primary Examiner* — Tsung-Yin Tsai

(57) ABSTRACT

An imager (10) and a reconstruction processor (12) generate an intensity image (14). A region containing a target volume is identified (20) and limited (24). A classifier (30) operates on the voxels in the limited volume with an enhancement filter to generate an enhanced image, such as an image whose voxel values represent a probability that each voxel is in the target volume. A segmentation processor (40) segments the enhanced image to identify the surface of the target volume to generate a segmented image which is displayed on a monitor (52) or used in a radiation therapy planning system (54).

19 Claims, 5 Drawing Sheets

(56) References Cited

U.S. PATENT DOCUMENTS

| | | | |
|---|---|---|---|
| 7,454,045 B2 | 11/2008 | Yao et al. | |
| 8,126,244 B2* | 2/2012 | Lu et al. | 382/131 |
| 8,184,888 B2* | 5/2012 | Lu et al. | 382/131 |
| 2003/0095715 A1* | 5/2003 | Avinash | 382/260 |
| 2003/0184730 A1* | 10/2003 | Price | 356/39 |
| 2004/0064029 A1* | 4/2004 | Summers et al. | 600/407 |
| 2005/0078858 A1* | 4/2005 | Yao et al. | 382/128 |
| 2008/0008367 A1* | 1/2008 | Franaszek et al. | 382/128 |
| 2008/0139920 A1* | 6/2008 | Biglieri et al. | 600/410 |
| 2008/0181479 A1* | 7/2008 | Yang et al. | 382/131 |
| 2010/0310140 A1* | 12/2010 | Schneider et al. | 382/130 |

FOREIGN PATENT DOCUMENTS

| | | |
|---|---|---|
| WO | 2006114003 A1 | 11/2006 |
| WO | 2008002633 A2 | 1/2008 |

OTHER PUBLICATIONS

Isgum, I., et al.; Detection of coronary calcifications from computed tomography scans for automated risk assessment of coronary artery disease; 2007; Med. Phys.; 34(4)1450-1461.

Kaus, M. R., et al.; Automated 3-D PDM Construction From Segmented Images Using Deformable Models; 2003; IEEE Trans. on Medical Imaging; 22(8)1005-1013.

Merickel, M. B., et al.; Segmentation of the Optic Nerve Head Combining Pixel Classification and Graph Search; 2007; Proc. of SPIE; vol. 6512,651215-1-10.

Pudil, P., et al.; Floating search methods in feature selection; 1994; Pattern Recognition Letters; 15:1119-1125.

Weese, J., et al.; Shape Constrained Deformable Models for 3D Medical Image Segmentation; 2001; LNCS; 2082:380-387.

* cited by examiner

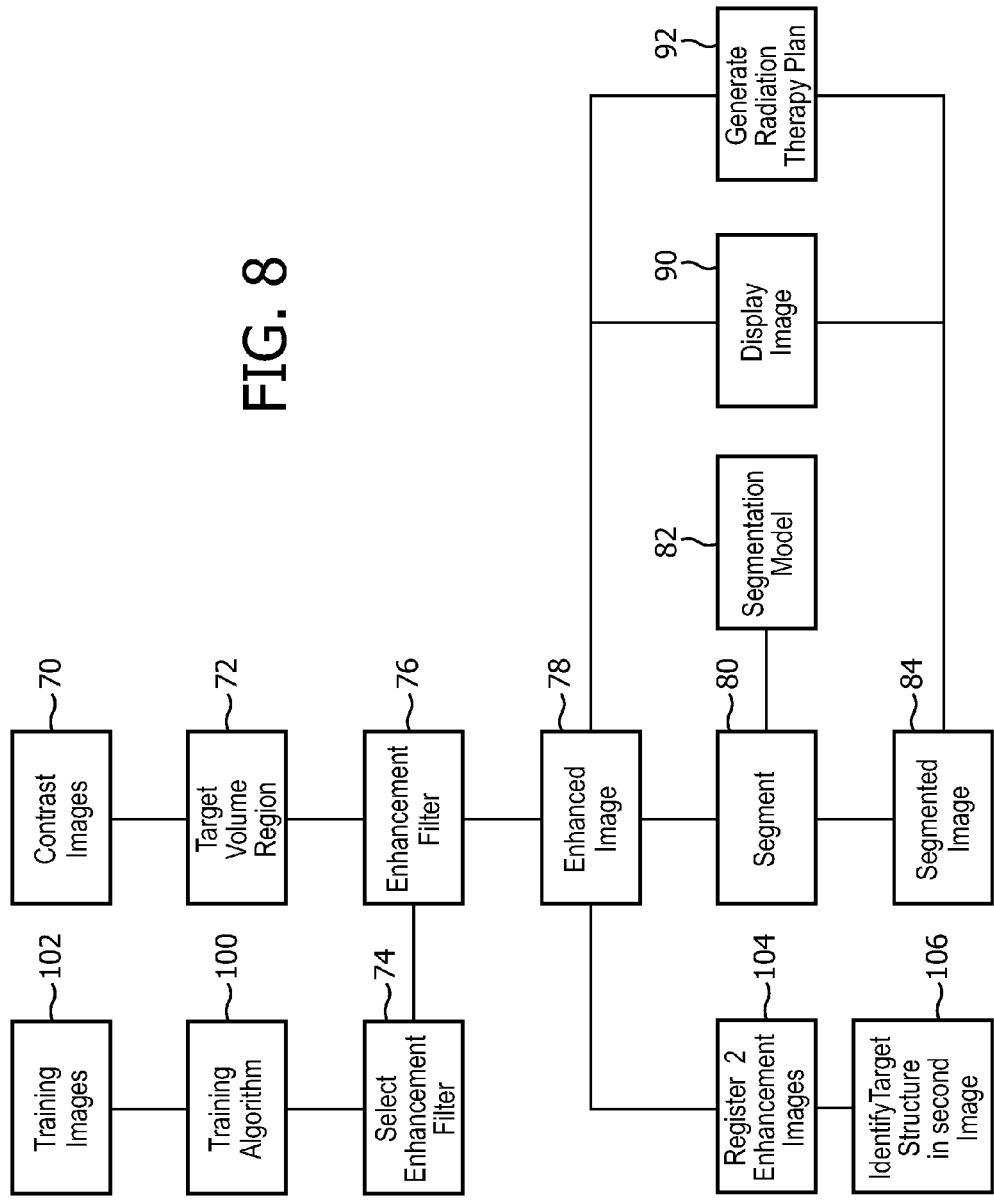

ORGAN-SPECIFIC ENHANCEMENT FILTER FOR ROBUST SEGMENTATION OF MEDICAL IMAGES

CROSS REFERENCE TO RELATED APPLICATIONS

This application is a national filing of PCI application Serial No. PCT/IB2011/053309, filed Jul. 25, 2011, published as WO 2012/014146 A2 on Feb. 2, 2012, which claims the benefit of U.S. provisional application Ser. No. 61/369,266 filed Jul. 30, 2010, which is incorporated herein by reference.

The present application relates to the medical imaging arts. It finds particular application in conjunction with the segmentation of medical images and will be described with particular reference thereto.

In medical images, segmentation is a process by which the boundary between one or more organs or tissues is clearly identified. Accurately segmenting medical images is important for many clinical applications. However, some organs or tissues are difficult to distinguish from adjoining organs or tissues.

For example, in radiation therapy, it is advantageous to deliver a relatively large radiation dose to the target volume, e.g., a tumor. But, target volumes are often closely adjacent and even neighboring high risk organs which can be damaged by high or even moderate doses of radiation. When planning the beam trajectories, it is important to know the boundaries of the target volume and the risk organs with accuracy. Failure to irradiate all portions of the tumor could lead to a rapid reoccurrence. Irradiating even a portion of a risk organ with high doses intended for a tumor can have adverse physical and health consequences.

Numerous automated segmentation techniques have been proposed for automatically segmenting the gray scale medical images of the patient. While these automated segmentation techniques are successful for many applications, automated segmentation is often not feasible due to the insufficient discrimination information provided by standard medical imaging modalities for certain types of tissue. One automated segmentation technique is model-based segmentation. In model-based segmentation, a model or outline of a nominal organ to be segmented is retrieved from computer memory. Features on the surface of the organ to be segmented which can be identified are correlated with corresponding features of the model. The model is then scaled, rotated, positioned, and deformed such that the model overlays the image with the identifiable image and model features directly overlaying each other. Areas of the surface of the organ which are not able to be discriminated from surrounding tissues are assumed to be the surface defined by the model which has been fit to the features of the image that could be discriminated. Because such assumptions are not always correct, greater certainty in the accuracy of the segmentation is wanted.

The present application describes a dedicated organ-specific feature enhancement solution aimed at improving the segmentation accuracy of medical images and, in particular, using 3D-model based methods.

In accordance with one aspect, an apparatus for segmenting medical images is provided. A memory stores an intensity medical image. One or more processors are programmed to operate on the intensity image with an enhancement filter based on a pool of features to generate an enhanced image which differentiates a target volume from neighboring tissue better than the intensity image. A memory stores the enhanced image.

In accordance with another aspect, a method of segmenting medical images is provided. A region of an intensity image containing a selected target volume is identified. The identified intensity image region is operated on with an enhancement filter based on a pool of features for generating the selected target volume from neighboring tissue to generate an enhancement image.

One advantage resides in greater segmentation accuracy.

Another advantage resides in improved reliability of clinical applications based on segmented images.

Another advantage resides in improved healthcare.

Still further advantages of the present invention will be appreciated to those of ordinary skill in the art upon reading and understand the following detailed description.

The invention may take form in various components and arrangements of components, and in various steps and arrangements of steps. The drawings are only for purposes of illustrating the preferred embodiments and are not to be construed as limiting the invention.

Figure 1:
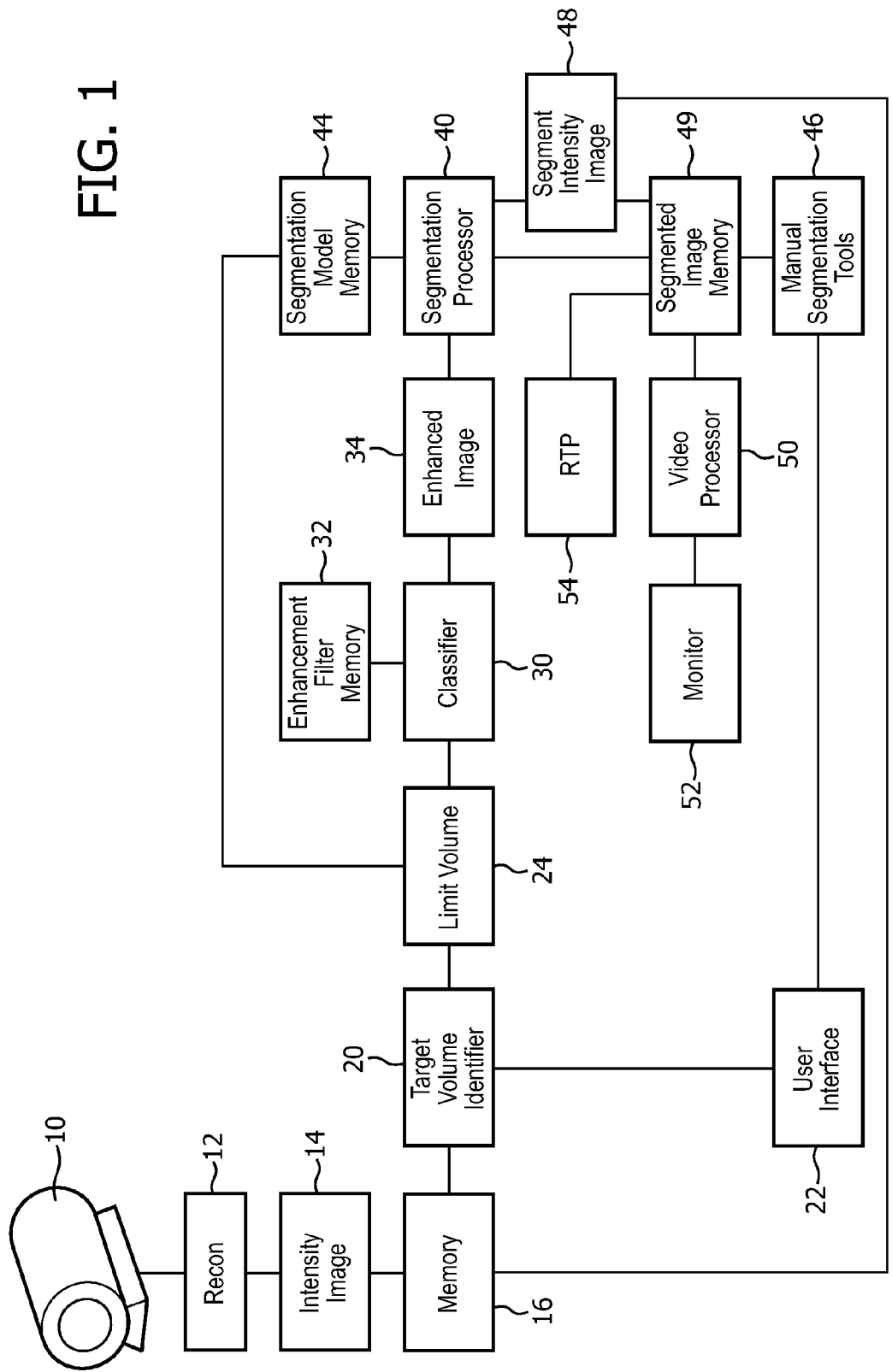
FIG. 1 is a diagrammatic illustration of a system for segmenting medical images.
Figure 4:
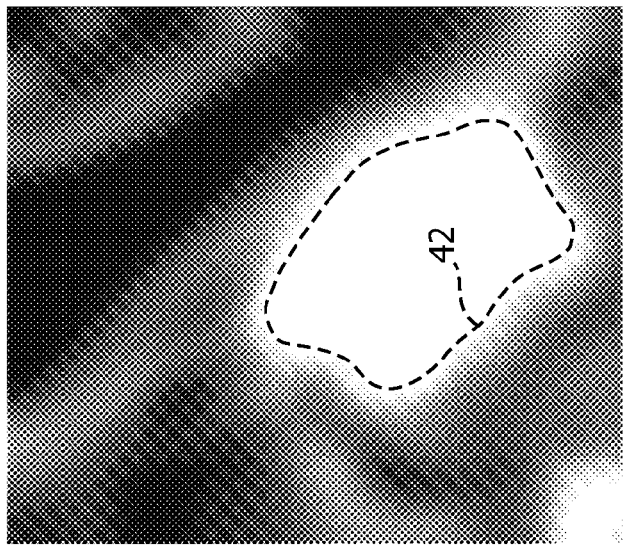
Figure 3:
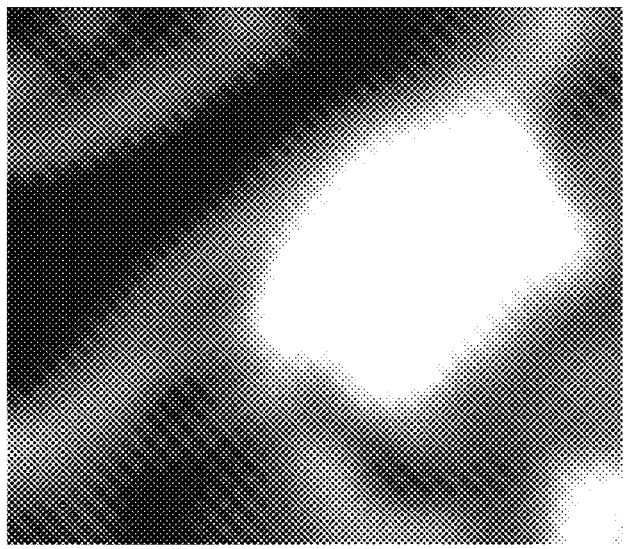
Figure 2:
FIG. 2 is a 2D, intensity image of a left submandibular gland.
Figure 5:
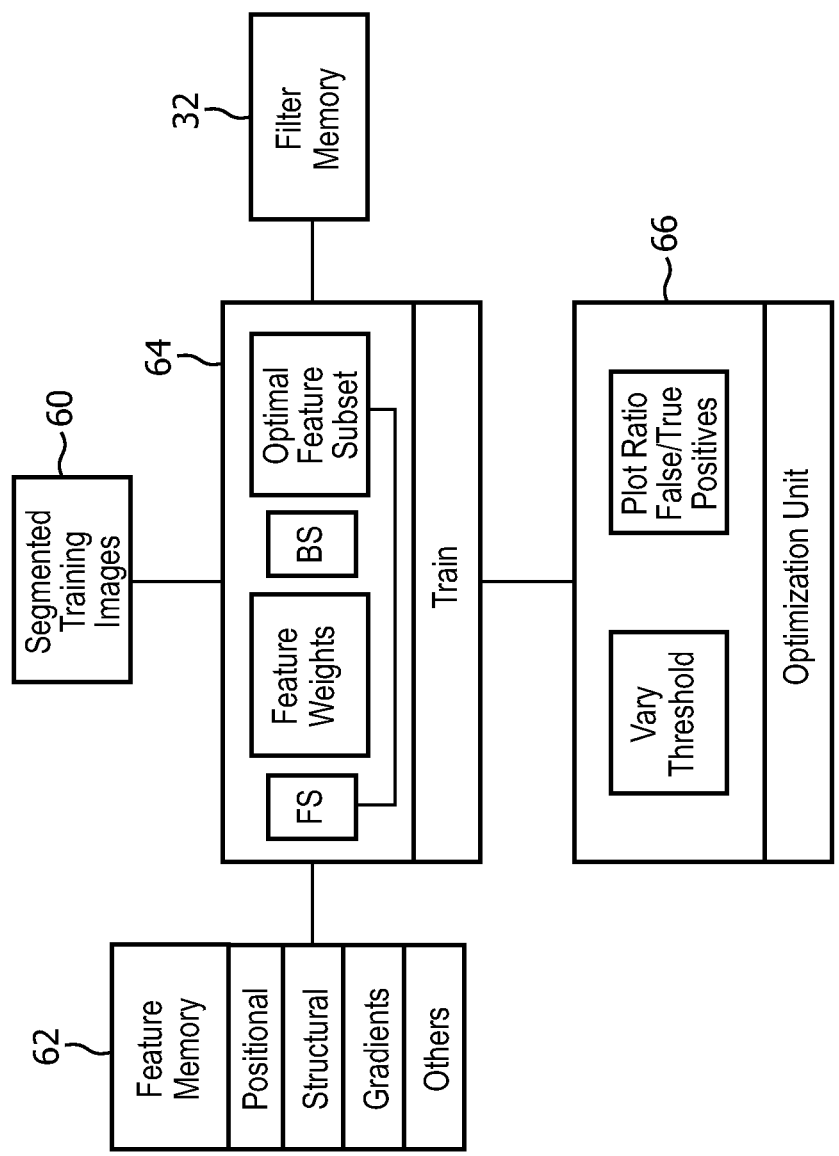
Figure 7:
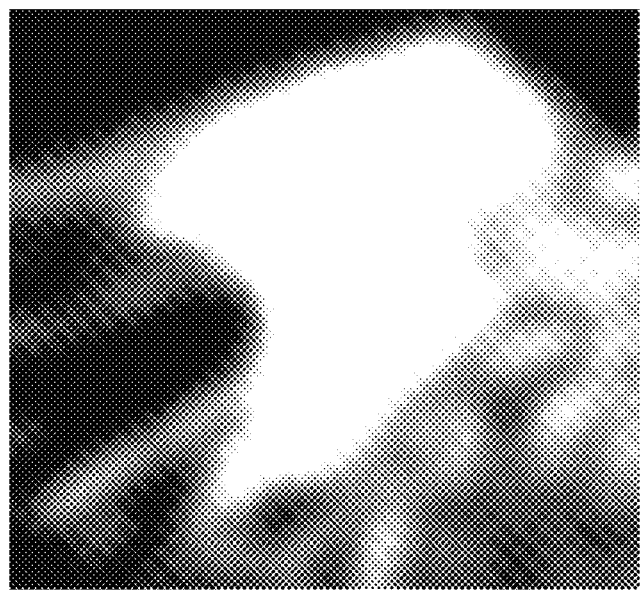
Figure 6:
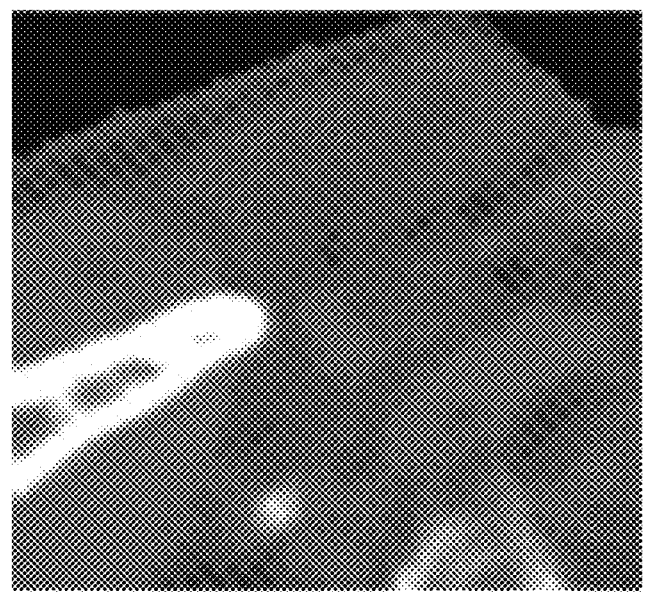

FIG. 3 the same slice image of the left submandibular gland with the same scale and same position as FIG. 2 after image enhancement with the present technique;

FIG. 4 depicts the enhanced slice image with the surface or boundary of the submandibular gland marked;

FIG. 5 is a diagrammatic illustration of a technique for generating enhancement or classification filters for use with the system of FIG. 1;

FIG. 6 is a 2D, intensity slice of a left parotid gland and surrounding biological structure;

FIG. 7 is a slice of the same volume of interest as FIG. 6, with the same scale and location in the image after enhancement in accordance with the present technique; and, FIG. 8 is a flow chart of a method of segmenting medical images.

With reference to FIG. 1, an imaging system 10, such as a magnetic resonance imaging system, a CT scanner, a positron emission tomography (PET) scanner, a single photon emission computed tomography (SPECT) scanner, an ultrasound scanner, radiographic imaging systems, other imaging systems, and combinations thereof, performs an examination of a subject. A reconstruction processor 12 reconstructs data from the imaging scanner 10 into an intensity or gray scale image 14 which is stored in a buffer or memory 16. In a CT scan, for example, the gray scale can represent the intensity or amount of radiation absorbed (or transmitted) by each voxel. In a PET image, as another example, the gray scale of the intensity image can represent the intensity or amount of radioisotope events occurring in each voxel. The memory 16 may be in a workstation associated with the scanner, a central hospital database, or the like.

A target volume identification unit 20 identifies a target volume in the intensity or gray scale image. In one embodiment, the target volume identification unit includes a video monitor which displays slices of the intensity image and a clinician, using a user interface device 22, denotes the location of the target volume. In another embodiment, the target volume identifying device includes a conventional 3D model segmentation routine which identifies the target volume in the intensity image and fits a 3D model to it. A volume limiting unit 24 defines a limited portion of the 3D image containing all or a selected portion of the target volume to be segmented with the present technique. In one embodiment, the limited volume is defined by the clinician manually using the user interface 22. In another embodiment, the model-based or other automated segmentation boundary is enlarged in three dimensions by a sufficient amount to ensure inclusion of the volume of interest or the selected portion of it. For example, the automatic segmentation can be enlarged by a fixed percentage, e.g., 25%. In another embodiment, the degree of enlargement can be a function of the degree of certainty in the accuracy of the intensity image segmentation.

A classifier or image enhancement unit 30 operates on the limited volume with a classification or enhancement filter retrieved from a classification or enhancement filter memory 32. The filter memory 32 is preloaded with appropriate filters for each of a plurality of target volumes. Applying the selected filter to the limited volume includes classifying each voxel of the limited volume based on a large pool of features including relative position features, texture features, intensity features, features of neighboring voxels, and the like. Such features include, but are not limited to a priori information on the shape of the selected target volume, structure and relative structural features of the selected target volume, intensity gradients in the neighborhood of each voxel, intensity variations and deviations, and the like. Mathematically, application of the filter may include considering voxel position, applying first or second derivatives, second or higher order tensors, Laplacian transforms, Gaussian functions, computing Eigenvalues of Hessian matrices, and making use of other first, second, and higher order mathematical operations. Applying the filter results in an enhanced image. In one embodiment, the voxel values of the enhanced image no longer represent an intensity, but rather represent a probability that each voxel is or is not classified as a member of the target volume, e.g., a probability that each voxel is in a target organ or tumor to be segmented.

FIG. 2 is illustrative of a slice of a limited volume of a CT intensity image in which the target volume is a left submandibular gland. In the example of FIG. 2, the bright region is illustrative of bone (higher radiation absorption) and the various gray scales denote the submandibular gland and various surrounding tissues and organs.

FIG. 3 illustrates one embodiment of the enhanced image 34 of the same slice of the submandibular gland with the submandibular gland in the same position and with the same scale as in FIG. 2. In the enhanced image, the gray scale denotes the probability, as determined by the classifier by applying the filter, that each voxel is a member of the selected target volume, brighter voxels indicating a higher probability and darker voxels indicating a lower probability. It will be noted that FIG. 3 identifies the periphery of the submandibular gland much more clearly than FIG. 2.

A segmentation processor 40 segments the enhanced image to identify an outer surface, illustrated as 42 in FIG. 4, of the target volume. In one embodiment, the segmentation processor 40 applies an automatic segmentation technique, particularly a model-based segmentation technique. The segmentation processor 40 selects a model from a model memory 44 which corresponds to the selected target volume. The segmentation processor 40 fits the segmentation model by translating, rotating, and scaling the segmentation model. The segmentation processor may also perform non-linear operations on the segmentation model to bring it more accurately into alignment with the target volume identified in the enhanced image. For example, the algorithm may cause like points in the enhanced image and the model to be attracted to each other. Optionally, the clinician may adjust the segmentation model 42 using a unit 46 which applies manual shaping tools. Additionally or alternately, an intensity image segmentation unit 48 applies the fit segmentation model to the intensity image 14 to generate a segmented intensity image. The final segmented image is stored in a memory 49 which may be the same as memory 16, a local buffer, a workstation memory, a patient database, or the like.

The above-described functions or steps have been described as being performed by units for simplicity of illustration. It is to be appreciated that these functions or steps can be performed by algorithms or routines implemented by one or more processors, ASICs, dedicated processing units, and combinations thereof. The present application further contemplates a computer-readable medium, such as a portable memory, e.g., DVD, memory stick, and the like, which carries the appropriate software routines for programming the one or more processors to perform the above-described technique.

The segmented image from the image memory can be withdrawn from the memory 48 by a video processor 50 and displayed on a monitor 52. In another embodiment, the segmented image from the memory 48 is retrieved by a radiation therapy planning system 54 which generates a radiation therapy plan for treating the target volume under consideration of other segmented volumes.

Although the segmentation operation has been described as segmenting a target volume, it is to be appreciated that this technique can be applied, e.g., repeatedly or concurrently, to segment a plurality of different target volumes in the reconstructed intensity image 14. For example, a tumor to be irradiated can be segmented, as can adjoining organs, which are to be subject to varying lesser degrees of radiation in order to generate a radiation treatment plan which delivers a sufficiently large radiation to the tumor and a sufficiently small amount of radiation to the various surrounding organs.

FIG. 5 illustrates one embodiment for generating the enhancement or classification filters which are stored in the filter memory 32. A plurality of images are segmented by a skilled segmentation clinician and stored in a segmented training image memory 60. A plurality of features of a nominal target volume are identified and stored in a feature memory 62. Ideally, tens of features, e.g., on the order of a hundred or more, are identified and stored. These features may include a priori information on the shape of the selected target volume, structure and relative structural features of the selected target volume, intensity gradients in the neighborhood of each voxel, intensity variations and deviations, and the like.

A training processor 64 uses the segmented training images to develop appropriate weightings for each of the identified features for each of a plurality of target volumes. The training processor may implement various algorithms to identify features used to classify any specific organ or target volume from the pool of multi-scaled textural structural and other features identified by an automatic feature selection step from the features 62. In one embodiment, a feature selection step based on sequential forward floating selection (SFFS) is used to chose the optimal subset of features for a given target volume. This includes a forward selection (FS) step followed by a backward selection (BS) step. The FS step starts from an empty set and adds features sequentially as long as the performance criterion improves. Subsequently, the BS step iteratively removes the least significant features according to the performance criterion. The FS and BS steps can be iteratively repeated. The outcome of the performance criterion is evaluated in each iteration. The forward and backward iterations are continued iteratively until the dimensionality of the feature space reaches a point after which improvement is not significant. An optimization unit or algorithm 66 determines a certainty level to be used for classifying each voxel. For a given performance criterion, an area under a receiver operating characteristic (ROC) curve is maximized. The ROC curve is determined by varying a threshold for each classifier and then plotting a ratio of false positives versus a ratio of true positives. In one embodiment in which the filter generates a value for each feature which denotes a scaled probability that each voxel of the training images is (or is not) in the volume of interest is determined. By adjusting the level of probability, an appropriate threshold or weighting for each feature of the filter is generated. These filters are then stored in the filter memory 32.

FIG. 6 illustrates a slice of a 3D intensity image 14' depicting a left parotid gland. FIG. 7 corresponds to the same slice with the same scale of the enhanced image 34 of the parotid gland of FIG. 6.

Once the enhancement filtering is complete, the enhanced image can be registered with a second image. In one embodiment, the enhanced image is registered to a second enhanced image, where the probability values are used instead of the gray values to compute a similarity measure between the images. A rigid or non-rigid transform which maximizes the similarity between both images is determined and applied to one of the images as a whole to bring the images into registration.

With reference to FIG. 8, an intensity image is generated in a step 70. A region of the intensity image which contains a selected target volume is selected in a step 72. One of a plurality of enhancement filters is selected which corresponds to the target volume in a step 74. In a step 76, the identified intensity image region is operated on with the selected enhancement filter based on a pool of features for differentiating the selected target volume from neighboring tissue to generate an enhanced image 78. In one embodiment, the enhanced image is a 3D image including a 3D array of voxels, a value of each voxel representing a probability that each voxel belongs to the target volume. In one embodiment, identifying the target volume region includes applying a model-based segmentation algorithm.

In a step 80, the enhanced image is segmented using a model-based segmentation process in which a segmentation model 82 is fit to the target volume of the enhancement image to generate a segmented image 84.

In a step 90, the enhanced or segmented image is displayed. In a step 92, a radiation therapy plan is generated from either the enhanced or the segmented image.

In a step 100, a training algorithm is applied to a plurality of accurately segmented training images 102 to generate a family of enhancement filters. The training images each have a pool of features which distinguish the target volume from other tissues. The training algorithm includes implementing a sequential forward floating selection algorithm which includes adding features of the pool of features to the training set to select a subset of features whose application improves accuracy and removing the significant features which contribute less to the accuracy. This adding and removing features is iteratively repeated until a preselected performance is reached. In a step 104, the enhanced image is registered with a second enhanced image. In a step 106, a differential target value is used to identify corresponding structure in the second enhanced image.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

Having thus described the performed embodiments, the invention is now claimed to be:

1. An apparatus for segmenting medical images comprising:
   a memory which stores a medical intensity image to be segmented; one or more processors programmed to:
   apply a pre-segmentation algorithm to the intensity image to estimate a boundary of a target volume and to enlarge said estimated boundary to ensure inclusion of said target volume in said enlarged estimated boundary,
   operate on the intensity image within the said enlarged estimated boundary with an enhancement filter based on a pool of features to generate an enhanced image which differentiates the target volume from neighboring tissue,
   wherein the enhanced image is a 2D/3D image including a 2D/3D array of voxels, a value of each voxel representing a probability that each voxel belongs to the target volume;
   a memory for storing the enhanced image.

2. The apparatus according to claim 1, further including:
   a segmentation processor for segmenting the enhanced image.

3. The apparatus according to claim 2, wherein the segmentation processor is a model-based segmentation processor and further including:
   a segmentation model memory for storing segmentation models for each of a plurality of potential target volumes.

4. The apparatus according to claim 1, further including:
   an enhancement filter memory for storing a plurality of the enhancement filters corresponding to each of a plurality of potential target volumes.

5. The apparatus according to claim 1, further including at least one of:
   a monitor which displays the enhanced image;
   a radiation therapy planning system which uses the enhanced image to generate a radiation therapy plan;
   an imaging device and reconstruction processor which performs an examination of a patient and reconstructs the intensity image from data generated by the imaging device.

6. An apparatus for segmenting medical images comprising:
   a memory configured to store a medical intensity image to be segmented;
   one or more processors programmed to:
   apply a model-based segmentation algorithm to the medical intensity image to estimate a surface of a target volume,
   enlarge the estimated target volume surface to ensure inclusion of the target volume within the enlarged estimated target volume,
   operate on the intensity image within the enlarged estimated target volume based on a pool of features to generate a probability image in which each voxel represents a probability whether each voxel is classified as a member of the target volume,
   segment the probability image to generate a segmentation boundary, and
   apply the segmentation boundary to the medical intensity image.

7. The apparatus according to claim 6, further including at least one of:
- a monitor configured to display the segmented medical intensity image; and,
- a memory configured to store at least one of the segmented medical intensity image and the segmentation boundary.

8. The apparatus according to claim 6, wherein segmenting the probability image includes:
- applying a model-based segmentation routine.

9. A method of segmenting medical images comprising:
- identifying a region of an intensity image containing a selected target volume,
- operating on the identified intensity image with an enhancement filter based on a pool of features for differentiating the selected target volume from neighboring tissue to generate a probability image, a value of each voxel of the probability image representing a probability that each voxel belongs to the selected target volume.

10. The method according to claim 9, wherein the enhanced image is a 3D image including a 3D array of voxels.

11. The method according to claim 9, further including:
- segmenting the probability image to generate a segmentation boundary estimating a surface of the selected target volume in the enhanced image;
- applying the segmentation boundary to the medical intensity image to estimate a surface of the selected target volume in the medical intensity image.

12. The method according to claim 11, wherein the segmentation of the enhanced image includes applying a model-based segmentation process in which a segmentation model of the target volume is fit to a differentiated target volume of the enhanced image.

13. The method according to claim 11, further including:
- performing a pre-segmentation routine on the intensity image to estimate a boundary of said target volume and enlarging said estimated boundary to ensure inclusion of said target volume in said pre-segmented and enlarged estimate boundary;
- wherein only a region within the enlarged estimated boundary is operated on with the enhancement filter.

14. The method according to claim 11, further including at least one of:
- displaying the segmented enhanced contrast image;
- generating a radiation therapy plan from the enhanced contrast image;
- performing an examination of a patient to generate imaging data and reconstructing the imaging data into the intensity image;
- storing the segmented medical contrast image in a memory.

15. The method according to claim 9, further including:
- with a training algorithm, operating on a plurality of accurately segmented training images with each of a pool of features which distinguish the target volume from other tissues to generate the enhancement filter.

16. The method according to claim 15, wherein employing the training algorithm includes implementing a sequential forward floating selection algorithm including:
- adding features of the pool of features to the training data set to select a subset of features whose application improves accuracy;
- removing the significant features which contribute the least to the accuracy of the filter; and
- iteratively adding and removing features until a preselected performance criteria is reached.

17. The method according to claim 9, further including:
- segmenting the probability image to estimate a boundary of the selected target volume;
- registering the probability image estimated boundary with a second intensity image;
- applying the estimated boundary to the second intensity image to identify corresponding structure in the second image.

18. A non-transitory computer readable medium carrying a computer program which controls one or more processors to perform the method of claim 9.

19. A workstation including one or more processors configured to perform the method of claim 9.

* * * * *